United States Patent
Wakayama et al.

(10) Patent No.: US 12,510,823 B2
(45) Date of Patent: Dec. 30, 2025

(54) RESIST UNDERLAYER FILM-FORMING COMPOSITION CONTAINING ALICYCLIC COMPOUND-TERMINATED POLYMER

(71) Applicant: NISSAN CHEMICAL CORPORATION, Tokyo (JP)

(72) Inventors: Hiroyuki Wakayama, Toyama (JP); Ryuta Mizuochi, Toyama (JP); Shou Shimizu, Toyama (JP); Yasunobu Someya, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1053 days.

(21) Appl. No.: 17/605,044

(22) PCT Filed: May 1, 2020

(86) PCT No.: PCT/JP2020/018436
§ 371 (c)(1),
(2) Date: Oct. 20, 2021

(87) PCT Pub. No.: WO2020/226141
PCT Pub. Date: Nov. 12, 2020

(65) Prior Publication Data
US 2022/0187707 A1  Jun. 16, 2022

(30) Foreign Application Priority Data
May 8, 2019 (JP) .................... 2019-088345

(51) Int. Cl.
| | | |
|---|---|---|
| *G03F 7/038* | (2006.01) | |
| *G03F 7/004* | (2006.01) | |
| *G03F 7/09* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *G03F 7/40* | (2006.01) | |

(52) U.S. Cl.
CPC .......... *G03F 7/0382* (2013.01); *G03F 7/0045* (2013.01); *G03F 7/09* (2013.01); *G03F 7/162* (2013.01); *G03F 7/2004* (2013.01); *G03F 7/325* (2013.01); *G03F 7/38* (2013.01); *G03F 7/40* (2013.01)

(58) Field of Classification Search
CPC . G03F 7/11; G03F 7/0382; G03F 7/09; G03F 7/091; C08G 59/40
See application file for complete search history.

(56) References Cited

U.S. PATENT DOCUMENTS

| | | | | |
|---|---|---|---|---|
| 2004/0229166 A1* | 11/2004 | Rushkin | ................. | C08G 73/22 |
| | | | | 430/281.1 |
| 2004/0241577 A1* | 12/2004 | Hatakeyama | ........... | G03F 7/038 |
| | | | | 430/271.1 |
| 2011/0059404 A1* | 3/2011 | Sakamoto | .............. | C08G 63/42 |
| | | | | 252/582 |
| 2011/0200938 A1 | 8/2011 | Yao et al. | | |
| 2015/0087155 A1* | 3/2015 | Endo | .................... | C09D 175/12 |
| | | | | 524/317 |
| 2015/0362838 A1 | 12/2015 | Endo et al. | | |

FOREIGN PATENT DOCUMENTS

| | | | | |
|---|---|---|---|---|
| JP | 2009-093162 A | | 4/2009 | |
| JP | 2017116803 A | * | 6/2017 | ......... C08G 64/0241 |
| TW | 200500799 A | | 1/2005 | |
| TW | 201137525 A | | 11/2011 | |
| WO | 2009/104685 A1 | | 8/2009 | |
| WO | 2013/141015 A1 | | 9/2013 | |
| WO | 2013/168610 A1 | | 11/2013 | |

OTHER PUBLICATIONS

English Machine Translation of JP2017116803A (Year: 2017).*
Jul. 21, 2020 International Search Report issued in International Patent Application No. PCT/JP2020/018436.
Nov. 2, 2021 International Preliminary Report on Patentability issued in International Patent Application No. PCT/JP2020/018436.
Aug. 20, 2024 Office Action issued in Taiwanese Patent Application No. 113117292.

* cited by examiner

*Primary Examiner* — Jonathan Johnson
*Assistant Examiner* — Alexander N. Lee
(74) *Attorney, Agent, or Firm* — Oliff PLC

(57) ABSTRACT

A composition for forming a resist underlayer film that enables the formation of a desired resist pattern; and a method for producing a resist pattern and a method for producing a semiconductor device, each of which uses the above-described resist underlayer film forming composition. A resist underlayer film forming composition which contains a polymer having, at an end, an aliphatic ring that may be substituted by a substituent, while having a carbon-carbon bond that may be interrupted by a heteroatom, and which additionally contains an organic solvent. The aliphatic ring is a monocyclic or polycyclic aliphatic ring having 3-10 carbon atoms. The polycyclic aliphatic ring is a bicyclic ring or a tricyclic ring.

19 Claims, No Drawings

RESIST UNDERLAYER FILM-FORMING COMPOSITION CONTAINING ALICYCLIC COMPOUND-TERMINATED POLYMER

TECHNICAL FIELD

The present invention relates to a composition used in a lithography process for semiconductor manufacturing, particularly in a lithography process on the cutting-edge of technology (ArF, EUV, EB, etc.). The present invention also relates to the application of a resist underlayer film from the composition, to a method for producing a substrate with patterned resist and to a method for manufacturing a semiconductor device.

BACKGROUND ART

In the conventional manufacturing of semiconductor devices, resist compositions are used in lithographic microfabrication. In the microfabrication process, a thin film of a photoresist composition is formed on a semiconductor substrate such as a silicon wafer and is irradiated with an active ray such as ultraviolet light through a mask pattern for drawing a device pattern. The latent image is then developed, and the substrate is etched using the obtained photoresist pattern as a protective film, thereby forming fine landscape corresponding to the pattern on the surface of the substrate. Due to the recent increase in the packing density of semiconductor devices, EUV light (13.5 nm wavelength) and EB (electron beam) have been studied for practical use in the leading-edge microfabrication in addition to the conventionally used active rays of i-ray (365 nm wavelength), KrF excimer laser beam (248 nm wavelength) and ArF excimer laser beam (193 nm wavelength). In the use of such active rays, serious problems are caused by diffused reflection from the semiconductor substrates and also by standing waves. An approach widely studied to solve these problems is to provide a bottom anti-reflective coating (BARC) between the resist and the semiconductor substrate. This anti-reflective coating is also called a resist underlayer film. Among such anti-reflective coatings, organic anti-reflective coatings made of, for example, a polymer having a light absorption site have widely been studied for reasons such as easy use.

Patent Literature 1 discloses a resist underlayer film-forming composition used in a lithography process for manufacturing semiconductor devices. This composition includes a polymer that contains a repeating unit structure having a polycyclic aliphatic ring in the main chain of the polymer. Patent Literature 2 discloses a lithographic resist underlayer film-forming composition that includes a polymer terminated with a specific structure.

CITATION LIST

Patent Literature

Patent Literature 1: JP 2009-093162 A
Patent Literature 2: WO 2013/141015 A1

SUMMARY OF INVENTION

Technical Problem

For example, the properties required of a resist underlayer film are that the resist underlayer film is not intermixed with a resist film formed on top thereof (is insoluble in a resist solvent) and that the dry etching rate is higher than that of a resist film.

In EUV lithography, the line width of a resist pattern that is formed is 32 nm or less, and a resist underlayer film for EUV exposure is formed with a smaller film thickness than before. Such a thin film is hardly uniform and tends to have defects such as pinholes and aggregations due to the influence of, for example, the substrate surface and the polymer used.

Meanwhile, in the formation of a resist pattern, a resist is sometimes developed by removing unexposed portions of the resist film with a solvent, usually an organic solvent, capable of dissolving the resist film, thus leaving the exposed portions of the resist film as a resist pattern. In such a negative development process, the major challenge resides in improving the adhesion of the resist pattern.

Further, there are demands that a resist pattern should be formed with a good rectangular shape while avoiding deterioration in LWR (line width roughness, variation (roughness)) in line width) at the time of resist pattern formation, and the resist sensitivity should be enhanced.

The objects of the present invention are to provide a composition for forming a resist underlayer film that allows a desired resist pattern to be formed, and to provide a resist pattern forming method using the resist underlayer film-forming composition, thereby solving the problems discussed above.

Solution to Problem

The present invention embraces the following.
[1] A resist underlayer film-forming composition comprising an organic solvent and a polymer having an aliphatic ring at a terminal, wherein the aliphatic ring optionally contains a carbon-carbon bond interrupted by a heteroatom, and wherein the aliphatic ring is optionally substituted with a substituent.
[2] The resist underlayer film-forming composition according to [1], wherein the aliphatic ring is a C3-C10 monocyclic or polycyclic aliphatic ring.
[3] The resist underlayer film-forming composition according to [2], wherein the polycyclic aliphatic ring is bicyclic or tricyclic.
[4] The resist underlayer film-forming composition according to any one of [1] to [3], wherein the aliphatic ring has at least one unsaturated bond.
[5] The resist underlayer film-forming composition according to any one of [1] to [4], wherein the substituent is selected from hydroxy group, a linear or branched C1-C10 alkyl group, C1-C20 alkoxy group, C1-C10 acyloxy group and carboxy group.
[6] The resist underlayer film-forming composition according to any one of [1] to [5], wherein the polymer has, in the main chain, at least one of the structural unit represented by formula (3) below:

[Chem. 1]

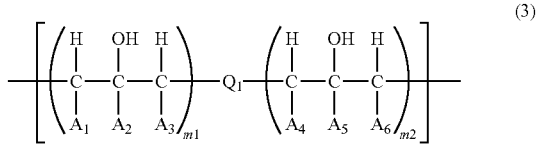

(in formula (3), $A_1$, $A_2$, $A_3$, $A_4$, $A_5$ and $A_6$ each independently denote a hydrogen atom, a methyl group or an ethyl group; $Q_1$ denotes a divalent organic group; and $m_1$ and m2 each independently denote 0 or 1).

[7] The resist underlayer film-forming composition according to [6], wherein $Q_1$ in formula (3) denotes a divalent organic group represented by formula (5) below:

[Chem. 2]

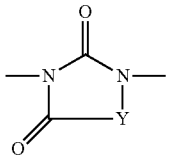

(5)

(wherein Y denotes a divalent group represented by formula (6) or formula (7) below)

[Chem. 3]

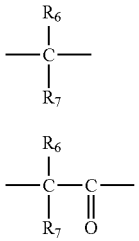

(6)

(7)

(wherein $R_6$ and $R_7$ each independently denote a hydrogen atom, a C1-C6 alkyl group, a C3-C6 alkenyl group, a benzyl group or a phenyl group, the phenyl group being optionally substituted with at least one member selected from the group consisting of a C1-C6 alkyl group, halogen atom, a C1-C6 alkoxy group, nitro group, cyano group and a C1-C6 alkylthio group, or $R_6$ and $R_7$ may be bonded to each other to form a C3-C6 ring together with the carbon atom to which $R_6$ and $R_7$ are bonded).

[8] The resist underlayer film-forming composition according to any one of [1] to [7], wherein the polymer further includes a disulfide bond in the main chain.

[9] The resist underlayer film-forming composition according to any one of [1] to [8], further comprising a curing catalyst.

[10] The resist underlayer film-forming composition according to any one of [1] to [9], further comprising a crosslinking agent.

[11] A resist underlayer film, which is a calcined product of a coating film comprising the resist underlayer film-forming composition according to any one of [1] to [10].

[12] A method for producing a patterned substrate, comprising the steps of:
applying the resist underlayer film-forming composition according to any one of [1] to [10] onto a semiconductor substrate and baking the resist underlayer film-forming composition to form a resist underlayer film;
applying a resist onto the resist underlayer film and baking the resist to form a resist film;
exposing the semiconductor substrate coated with the resist underlayer film and the resist; and
developing the exposed resist film to perform patterning.

[13] A method for manufacturing a semiconductor device, comprising the steps of:
forming on a semiconductor substrate a resist underlayer film using the resist underlayer film-forming composition according to any one of [1] to [10];
forming a resist film on the resist underlayer film;
forming a resist pattern by irradiating the resist film with light or electron beam followed by development;
forming a patterned resist underlayer film by etching the resist underlayer film through the formed resist pattern; and
processing the semiconductor substrate through the patterned resist underlayer film.

Advantageous Effects of Invention

In the lithographic resist underlayer film-forming composition of the present invention, the polymer (also referred to as the high-molecular compound) contained in the resist underlayer film-forming composition is terminated, or capped, with an aliphatic ring, which may contain a carbon-carbon bond interrupted by a heteroatom, and which may be substituted with a substituent. The composition includes such a polymer and an organic solvent, and preferably further includes a crosslinking agent and/or a compound that accelerates the crosslinking reaction (a curing catalyst). This design allows the lithographic resist underlayer film-forming composition of the subject application to form a resist pattern having a good rectangular shape (without pattern collapse), and also reduces the deterioration in LWR and improves the sensitivity at the time of resist pattern formation.

DESCRIPTION OF EMBODIMENTS

《《Definition of Terms》》

The terms used in the present invention have the following definitions unless otherwise specified.

Examples of the "C1-C10 alkyl groups" include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, decyl group, undecyl group, dodecyl group, tridecyl group, tetradecyl group, pentadecyl group, hexadecyl group, heptadecyl group, octadecyl group, nonadecyl group and eicodecyl group.

Examples of the "C1-C20 alkoxy groups" include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, 1-ethyl-2-methyl-n-propoxy group, cyclopentyloxy group, cyclohexyloxy group, norbornyloxy group, adamantyloxy group, adamantanemethyloxy group, adamantaneethyloxy group, tetracyclodecanyloxy group and tricyclodecanyloxy group.

Examples of the "C1-C10 acyloxy groups" include those represented by the following formula (20):
[Chem. 4]

$$Z-COO-* \quad \text{formula (20)}$$

(In formula (20), Z denotes a hydrogen atom or a "C1-C9 alkyl group" selected from the above "C1-C10 alkyl groups"; and * denotes a bond to the "aliphatic ring".)

Examples of the "C3-C6 alkenyl groups" include 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group and 3-cyclohexenyl group.

Examples of the "C1-C6 alkylthio groups" include methylthio group, ethylthio group, propylthio group, butylthio group, pentylthio group and hexylthio group.

Examples of the "halogen atoms" include fluorine atom, chlorine atom, bromine atom and iodine atom.

Examples of the "C6-C40 arylene groups" include phenylene group, o-methylphenylene group, m-methylphenylene group, p-methylphenylene group, o-chlorophenylene group, m-chlorophenylene group, p-chlorophenylene group, o-fluorophenylene group, p-fluorophenylene group, o-methoxyphenylene group, p-methoxyphenylene group, p-nitrophenylene group, p-cyanophenylene group, α-naphthylene group, p-naphthylene group, o-biphenylylene group, m-biphenylylene group, p-biphenylylene group, β-anthrylene group, 2-anthrylene group, 9-anthrylene group, 1-phenanthrylene group, 2-phenanthrylene group, 3-phenanthrylene group, 4-phenanthrylene group and 9-phenanthrylene group.

⟨Resist Underlayer Film-Forming Compositions⟩

A resist underlayer film-forming composition of the subject application comprises a polymer and an organic solvent. The polymer in the resist underlayer film-forming composition is terminated with an aliphatic ring, which optionally contains a carbon-carbon bond interrupted by a heteroatom, and which is optionally substituted with a substituent.

The phrase that the aliphatic ring optionally contains a carbon-carbon bond interrupted by a heteroatom means that the aliphatic ring of the subject application includes an —O— or —S— bond between carbon atoms.

The phrase that the aliphatic ring is optionally substituted with a substituent means that the aliphatic ring of the subject application is substituted with, for example, one or more hydroxy groups, linear or branched C1-C10 alkyl groups, C1-C20 alkoxy groups, C1-C10 acyloxy groups and carboxy groups in place of all or part of the hydrogen atoms.

The aliphatic ring is preferably a C3-C10 monocyclic or polycyclic aliphatic ring.

Examples of the "C3-C10 monocyclic or polycyclic aliphatic rings" include cyclopropane, cyclobutane, cyclopentane, cyclohexane, cyclohexene, cycloheptane, cyclooctane, cyclononane, cyclodecane, spirobicyclopentane, bicyclo[2.1.0]pentane, bicyclo[3.2.1]octane, tricyclo[3.2.1.0$^{2,7}$]octane, spiro[3,4]octane, norbornane, norbornene and tricyclo[3.3.1.1$^{3,7}$]decane (adamantane).

The polycyclic aliphatic ring is preferably a bicyclic ring or a tricyclic ring.

Among such rings, examples of the bicyclic rings include norbornane, norbornene, spirobicyclopentane, bicyclo[2.1.0]pentane, bicyclo[3.2.1]octane and spiro[3,4]octane.

Among the rings mentioned above, examples of the tricyclic rings include tricyclo[3.2.1.0$^{2,7}$]octane and tricyclo[3.3.1.1$^{3,7}$]decane (adamantane).

The aliphatic ring preferably has at least one unsaturated bond (for example, a double bond or a triple bond). The aliphatic ring preferably has one to three unsaturated bonds. The aliphatic ring preferably has one or two unsaturated bonds. The unsaturated bond is preferably a double bond.

Specific examples of the "aliphatic rings optionally containing a carbon-carbon bond interrupted with a heteroatom and being optionally substituted with a substituent" may be derived by reacting any of the compounds illustrated below with a polymer terminal by a method known per se.

[Chem. 5]

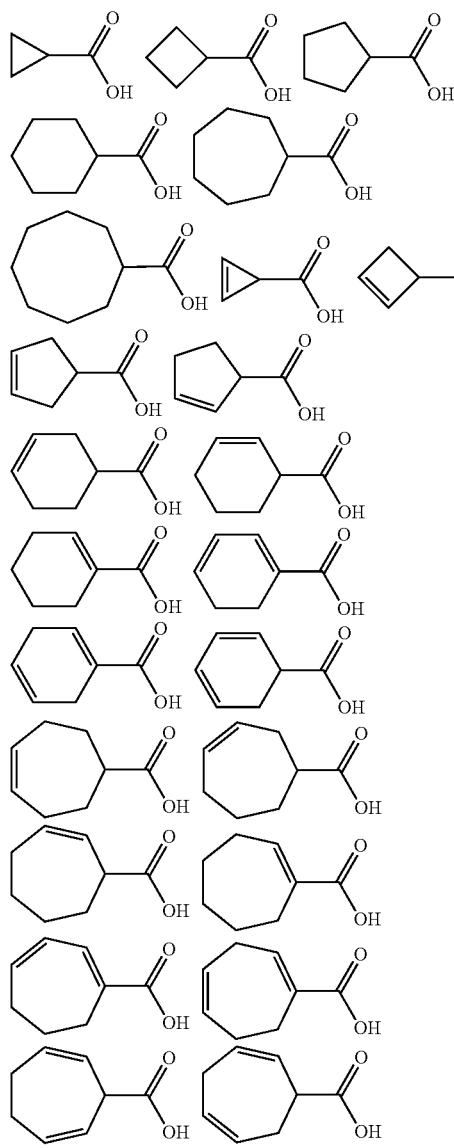

-continued

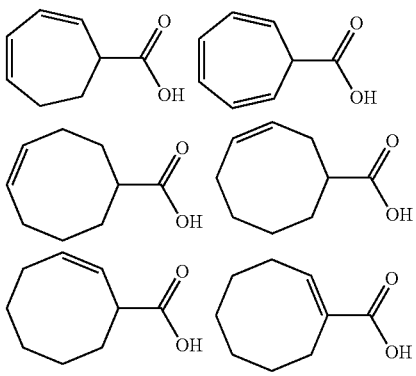

[Chem. 6]

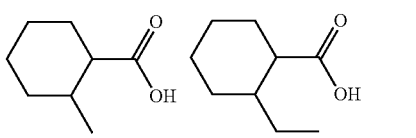

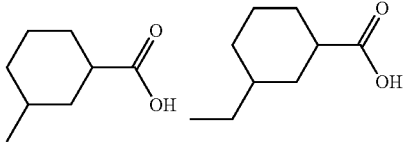

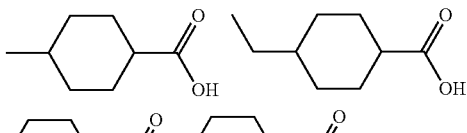

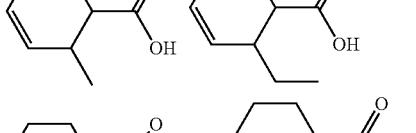

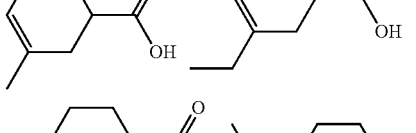

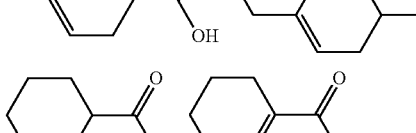

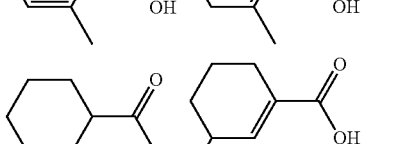

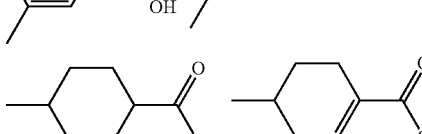

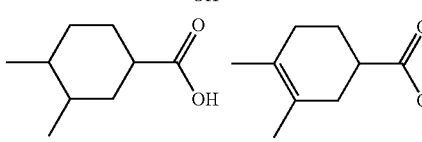

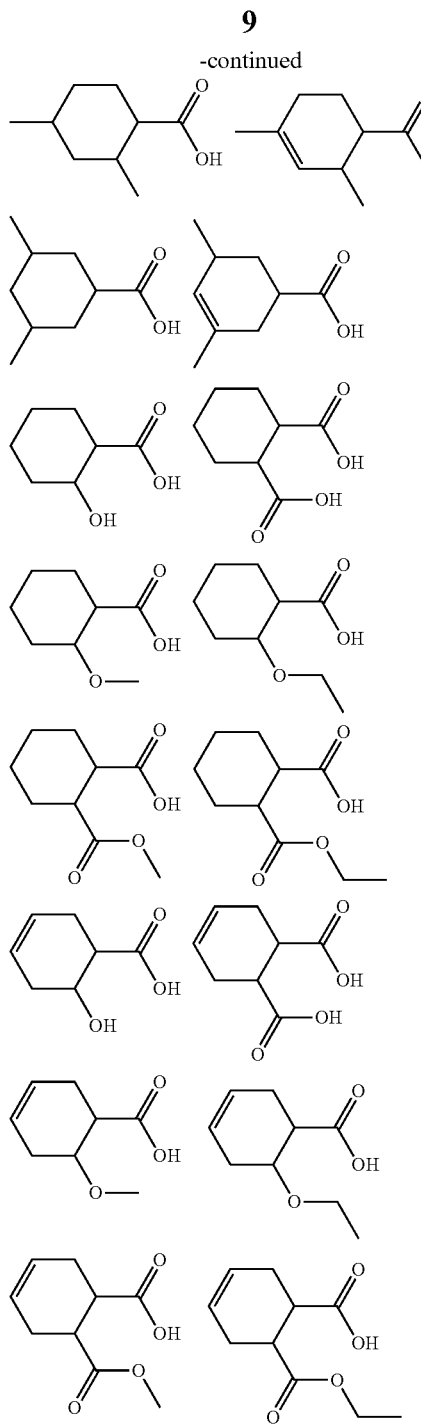
[Chem. 7]
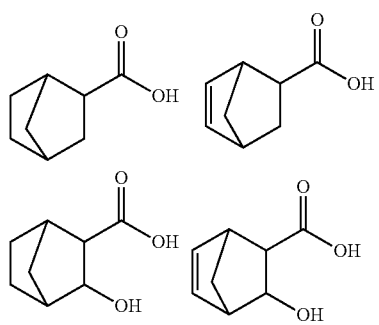
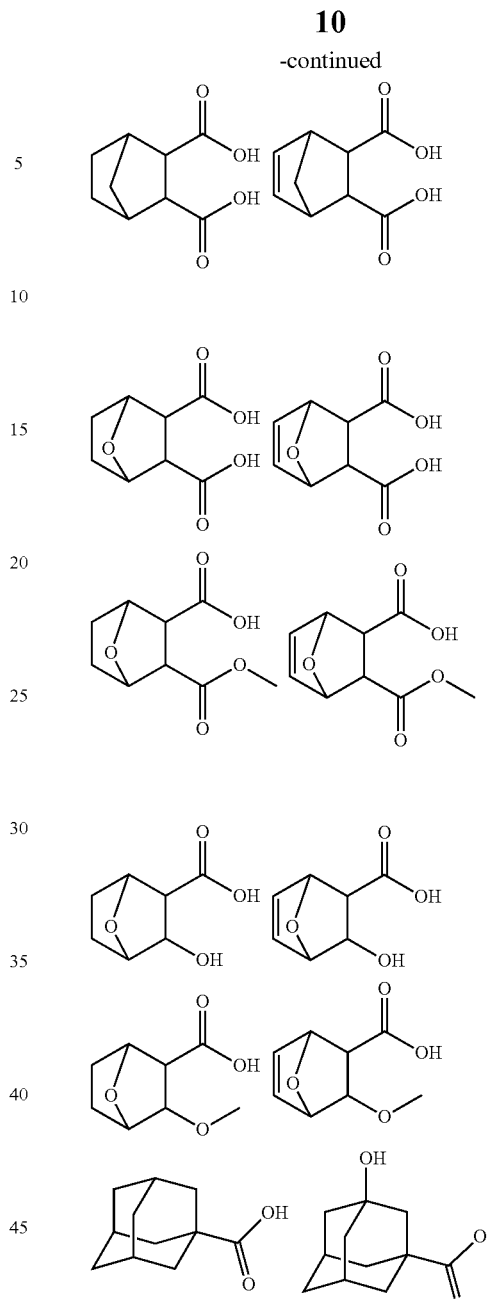
The polymer preferably has, in the main chain, at least one of the structural unit represented by formula (3) below:
[Chem. 8]
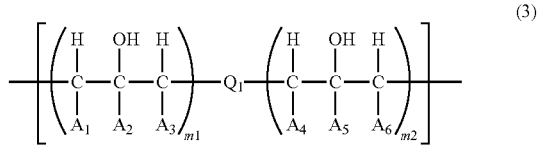
(in formula (3), $A_1$, $A_2$, $A_3$, $A_4$, $A_5$ and $A_6$ each independently denote a hydrogen atom, a methyl group or an ethyl group; $Q_1$ denotes a divalent organic group; and $m_1$ and m2 each independently denote 0 or 1).

$Q_1$ in formula (3) preferably denotes a divalent organic group represented by formula (5) below:

[Chem. 9]

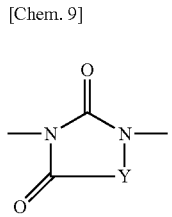
(5)

(wherein Y denotes a divalent group represented by formula (6) or formula (7) below)

[Chem. 10]

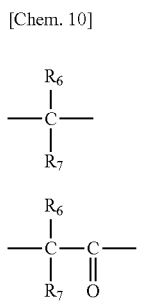
(6)

(7)

(wherein $R_6$ and $R_7$ each independently denote a hydrogen atom, a C1-C6 alkyl group, a C3-C6 alkenyl group, a benzyl group or a phenyl group, the phenyl group being optionally substituted with at least one member selected from the group consisting of a C1-C6 alkyl group, halogen atom, a C1-C6 alkoxy group, nitro group, cyano group and a C1-C6 alkylthio group, or $R_6$ and $R_7$ may be bonded to each other to form a C3-C6 ring together with the carbon atom to which $R_6$ and $R_7$ are bonded).

Examples of the "C3-C6 ring" include cyclopropane, cyclobutane, cyclopentane, cyclopentadiene and cyclohexane.

It is preferable that the polymer further include a disulfide bond in the main chain.

The polymer preferably includes a C6-C40 arylene group optionally substituted with a substituent. The substituent is the same as defined hereinabove.

The weight average molecular weight of the polymer is, for example, 2,000 to 50,000.

Examples of the monomers capable of forming structural units of formula (3) in which $m_1$ and $m_2$ are 1 include compounds with two epoxy groups represented by formulas (10-a) to (10-k) below:

[Chem. 11]

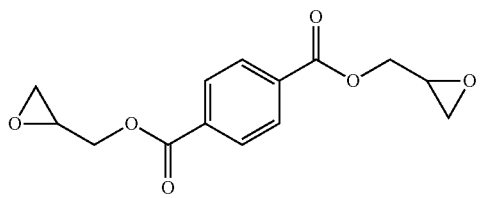
(10-a)

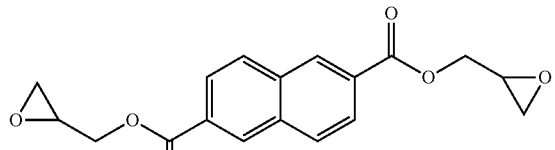
(10-b)

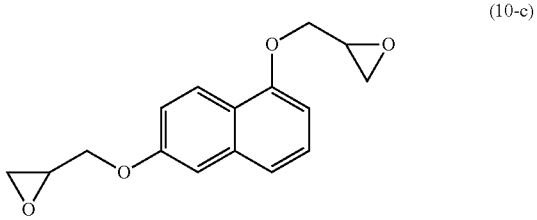
(10-c)

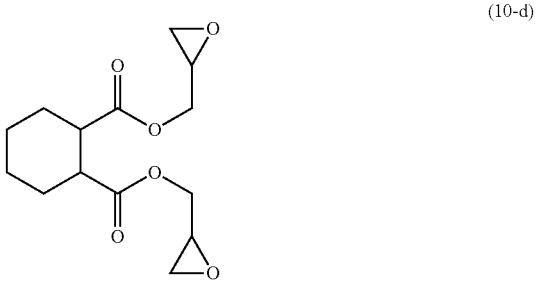
(10-d)

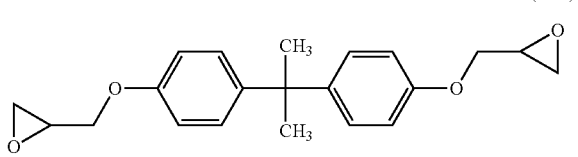
(10-e)

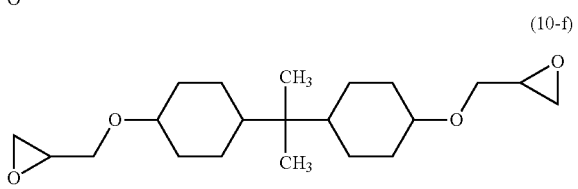
(10-f)

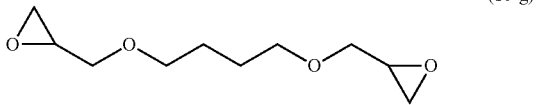
(10-g)

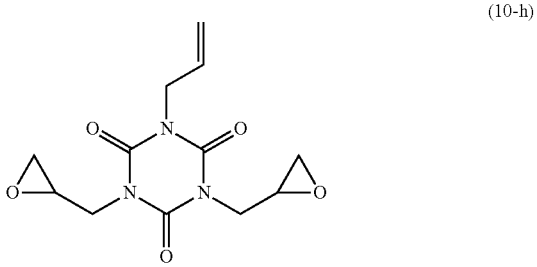
(10-h)

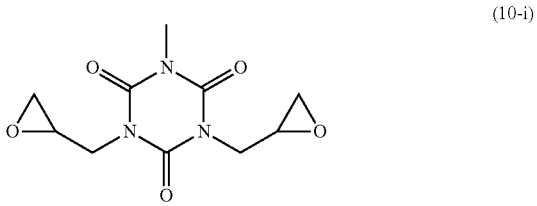
(10-i)

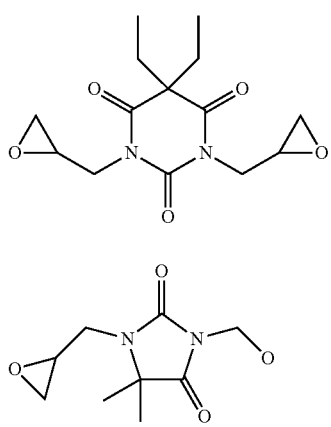

That is, such compounds include diglycidyl 1,4-terephthalate, diglycidyl 2,6-naphthalenedicarboxylate, 1,6-dihydroxynaphthalene diglycidyl, diglycidyl 1,2-cyclohexanedicarboxylate, 2,2-bis(4-hydroxyphenyl)propane diglycidyl, 2,2-bis(4-hydroxycyclohexane)propane diglycidyl, 1,4-butanediol diglycidyl, diglycidyl monoallylisocyanurate, diglycidyl monomethylisocyanurate, diglycidyl 5,5-diethylbarbiturate and 5,5-dimethylhydantoin diglycidyl; however, they are not limited to these examples.

Examples of the monomers capable of forming the structural unit of formula (3), in which $m_1$ and $m2$ are 0, include compounds represented by formulas (11-a) to (11-s) below, with two carboxyl groups, hydroxyphenyl groups or imide groups, and acid dianhydrides:

[Chem. 12]

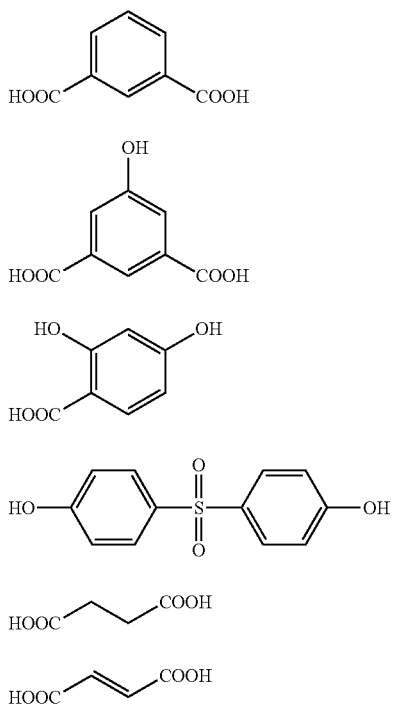

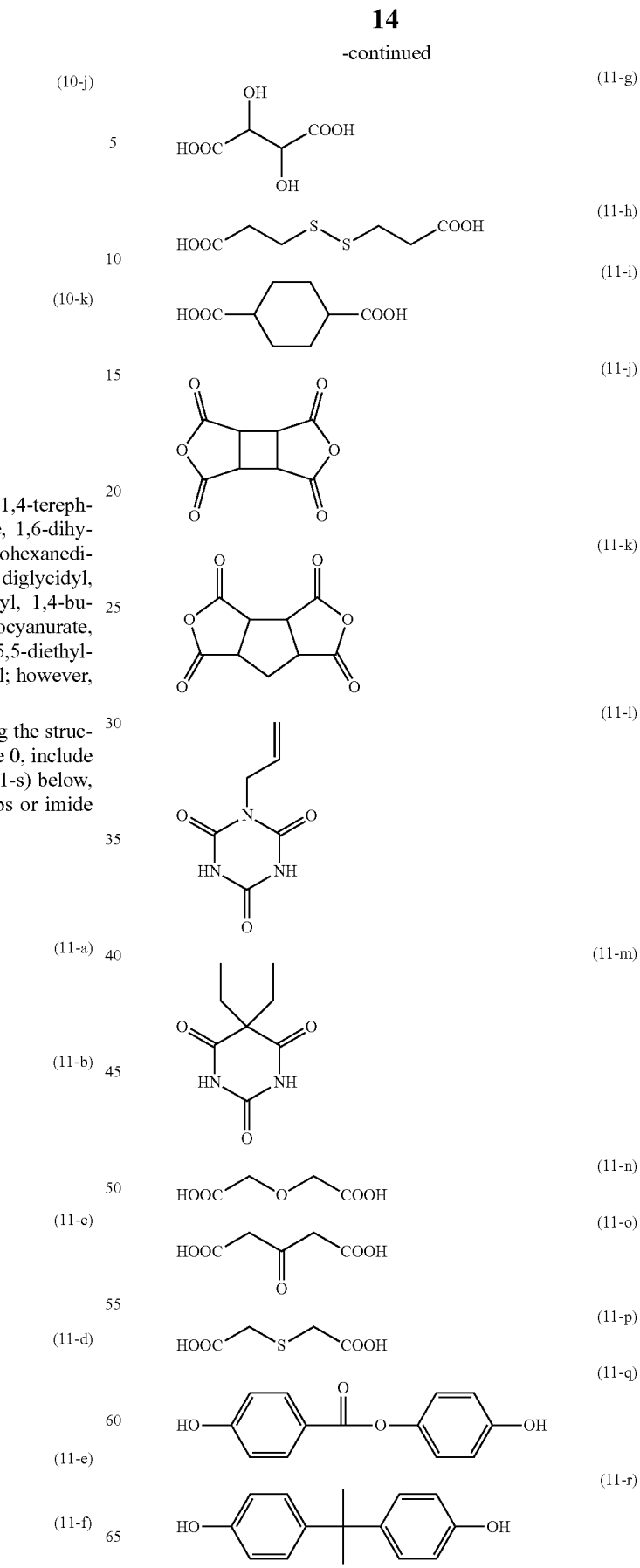

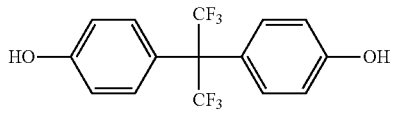

(11-s)

That is, such compounds include isophthalic acid, 5-hydroxyisophthalic acid, 2,4-dihydroxybenzoic acid, 2,2-bis(4-hydroxyphenyl)sulfone, succinic acid, fumaric acid, tartaric acid, 3,3'-dithiodipropionic acid, 1,4-cyclohexanedicarboxylic acid, cyclobutanoic dianhydride, cyclopentanoic dianhydride, monoallylisocyanuric acid, 5,5-diethylbarbituric acid, diglycolic acid, acetonedicarboxylic acid, 2,2'-thiodiglycolic acid, 4-hydroxybenzoic acid-4-hydroxyphenyl, 2,2-bis(4-hydroxyphenyl)propane, 2,2-bis(4-hydroxyphenyl)hexafluoropropane, 1,3-bis(carboxymethyl)-5-methyl isocyanurate and 1,3-bis(carboxymethyl)-5-allyl isocyanurate; however, they are not limited to these examples.

A (bifunctional) monomer capable of forming a structural unit of formula (3) in which $m_1$ and $m_2$ are 1, and a (bifunctional) monomer capable of forming a structural unit of formula (3) in which $m_1$ and $m_2$ are 0 may be copolymerized in a copolymerization ratio (a feed weight ratio) of, for example, 1:2 to 2:1.

Further, a monomer for introducing an aliphatic ring to a polymer terminal of the subject application (a monomer having a single site that mainly reacts with the polymer) may be fed in a feed weight ratio of the monomer to the total amount of the above monomers of, for example, 20:1 to 5:1.

The term "functional" is a concept focused on the chemical properties and chemical reactivity of a substance and, when used as "functional group", it assumes that the group has its inherent properties and chemical reactivity. In the subject application, the term means having a reactive substituent capable of bonding to another compound.

The number of repetitions of the structural unit represented by formula (3) is, for example, within the range of not less than 5 and not more than 10,000.

Examples of the organic solvents contained in the resist underlayer film-forming compositions of the present invention include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide and N,N-dimethylacetamide. The solvents may be used each alone or in combination of two or more.

Of the solvents mentioned above, for example, propylene glycol monomethyl ether, propylene glycol monomethyl ether acetate, ethyl lactate, butyl lactate and cyclohexanone are preferable. In particular, propylene glycol monomethyl ether and propylene glycol monomethyl ether acetate are preferable.

The proportion of the organic solvent to the resist underlayer film-forming composition of the present invention is, for example, not less than 50% by mass and not more than 99.9% by mass.

The polymer contained in the resist underlayer film-forming composition of the present invention ranges, for example, 0.1% by mass to 50% by mass of the resist underlayer film-forming composition.

In addition to the polymer and the organic solvent, the resist underlayer film-forming composition of the present invention may include a crosslinking agent and a crosslinking catalyst (a curing catalyst), which is a compound promoting the crosslinking reaction. When the solid content is defined as the balance after elimination of the organic solvent from the resist underlayer film-forming composition of the present invention, the solid includes the polymer and optionally added additives, such as a crosslinking agent and a crosslinking catalyst. The proportion of the additives is, for example, within the range of 0.1% by mass to 50% by mass, and preferably 1% by mass to 30% by mass of the solid content of the resist underlayer film-forming composition of the present invention.

Examples of the crosslinking agent used as an optional component in the resist underlayer film-forming compositions of the present invention include hexamethoxymethylmelamine, tetramethoxymethylbenzoguanamine, 1,3,4,6-tetrakis(methoxymethyl)glycoluril (tetramethoxymethylglycoluril) (POWDERLINK [registered trademark] 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea and 3,3',5,5'-tetrakis(methoxymethyl)4,4'-biphenol. When the crosslinking agent is used, the content of the crosslinking agent is, for example, within the range of 1% by mass to 50% by mass, and preferably 5% by mass to 30% by mass relative to the polymer.

Examples of the curing catalyst (the crosslinking catalyst) used as an optional component in the resist underlayer film-forming compositions of the present invention include sulfonic acid compounds and carboxylic acid compounds such as p-toluenesulfonic acid, trifluoromethanesulfonic acid, pyridinium-p-toluenesulfonate (pyridinium-p-toluenesulfonic acid), pyridinium-p-hydroxybenzenesulfonic acid, pyridinium-trifluoromethanesulfonic acid, cyclohexyl p-toluenesulfonate, morpholine, p-toluene sulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid and hydroxybenzoic acid. When the crosslinking catalyst is used, the content of the crosslinking catalyst is, for example, within the range of 0.1% by mass to 50% by mass, and preferably 1% by mass to 30% by mass relative to the crosslinking agent.

In order to reduce the occurrence of defects such as pinholes or striation and to further enhance the applicability to surface unevenness, the resist underlayer film-forming composition of the present invention may further include a surfactant. Examples of the surfactant include nonionic surfactants such as polyoxyethylene alkyl ethers including polyoxyethylene lauryl ether, polyoxyethylene stearyl ether, polyoxyethylene cetyl ether and polyoxyethylene oleyl ether, polyoxyethylene alkylallyl ethers including polyoxyethylene octylphenol ether and polyoxyethylene nonylphenol ether, polyoxyethylene/polyoxypropylene block copolymers, sorbitan fatty acid esters including sorbitan monolaurate, sorbitan monopalmitate, sorbitan monostearate, sorbitan monooleate, sorbitan trioleate and sorbitan tristearate, and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, fluorosurfactants such as EFTOP series EF301, EF303 and EF352 (trade names, manufactured by Mitsubishi Materials Electronic Chemicals Co., Ltd.), MEGAFACE series F171, F173 and R-30 (trade names, manufactured by DIC CORPORATION), Fluorad series FC430 and FC431 (trade names, manufactured by Sumitomo 3M Limited), AsahiGuard AG710, and Surflon series S-382, SC101, SC102, SC103, SC104, SC105 and SC106 (trade names, manufactured by AGC Inc.), and organosiloxane polymer KP341 (manufactured by Shin-Etsu Chemical Co., Ltd.). The amount of the surfactant is usually not more than 2.0% by mass, and preferably not more than 1.0% by mass of the total solid content of the resist underlayer film-forming composition of the present invention. The surfactants may be used each alone or in combination of two or more.

⟨Resist Underlayer Films⟩

A resist underlayer film of the present invention may be produced by applying the resist underlayer film-forming composition described hereinabove onto a semiconductor substrate and calcining the composition.

Examples of the semiconductor substrate to which the resist underlayer film-forming composition of the present invention is applied include silicon wafers, germanium wafers, and compound semiconductor wafers such as gallium arsenide, indium phosphide, gallium nitride, indium nitride and aluminum nitride.

The semiconductor substrate that is used may have an inorganic film on its surface. For example, such an inorganic film is formed by ALD (atomic layer deposition), CVD (chemical vapor deposition), reactive sputtering, ion plating, vacuum deposition or spin coating (spin on glass: SOG). Examples of the inorganic film include polysilicon films, silicon oxide films, silicon nitride films, BPSG (boro-phospho silicate glass) films, titanium nitride films, titanium oxynitride films, tungsten films, gallium nitride films and gallium arsenide films.

The resist underlayer film-forming composition of the present invention is applied onto such a semiconductor substrate with an appropriate application means such as a spinner or a coater. Thereafter, the composition is baked with a heating device such as a hot plate, to form a resist underlayer film. The baking conditions are appropriately selected from baking temperatures of 100° C. to 400° C. and amounts of baking time of 0.3 minutes to 60 minutes. Preferably, the baking temperature is within the range of 120° C. to 350° C. and the baking time is within the range of 0.5 minutes to 30 minutes. More preferably, the baking temperature is within the range of 150° C. to 300° C. and the baking time is within the range of 0.8 minutes to 10 minutes.

The film thickness of the resist underlayer film that is formed is, for example, within the range of 0.001 μm (1 nm) to 10 μm, 0.002 μm (2 nm) to 1 μm, 0.005 μm (5 nm) to 0.5 μm (500 nm), 0.001 μm (1 nm) to 0.05 μm (50 nm), 0.002 μm (2 nm) to 0.05 μm (50 nm), 0.003 μm (1 nm) to 0.05 μm (50 nm), 0.004 μm (4 nm) to 0.05 μm (50 nm), 0.005 μm (5 nm) to 0.05 μm (50 nm), 0.003 μm (3 nm) to 0.03 μm (30 nm), 0.003 μm (3 nm) to 0.02 μm (20 nm), or 0.005 μm (5 nm) to 0.02 μm (20 nm). If the baking temperature is lower than the range mentioned above, crosslinking may be insufficient. If, on the other hand, the baking temperature is higher than the above range, the resist underlayer film may be decomposed by heat.

⟨Method for Producing a Patterned Substrate, and Method for Manufacturing a Semiconductor Device⟩

A patterned substrate is produced through the following steps. Usually, a patterned substrate is produced by forming a photoresist layer on a resist underlayer film. The photoresist that is formed on the resist underlayer film by application and calcination according to a method known per se is not particularly limited as long as the resist is sensitive to light used for exposure. Any of negative photoresists and positive photoresists may be used, such as positive photoresists composed of a novolak resin and 1,2-naphthoquinonediazide sulfonic acid ester, chemically amplified photoresists composed of a photoacid generator and a binder having a group that is decomposed by an acid to increase the alkali dissolution rate, chemically amplified photoresists composed of an alkali-soluble binder, a photoacid generator and a low-molecular compound that is decomposed by an acid to increase the alkali dissolution rate of the photoresist, chemically amplified photoresists composed of a photoacid generator, a binder having a group that is decomposed by an acid to increase the alkali dissolution rate, and a low-molecular compound that is decomposed by an acid to increase the alkali dissolution rate of the photoresist, and resists containing metal elements. Examples include V146G, product name, manufactured by JSR CORPORATION, APEX-E, product name, manufactured by Shipley, $PAR_{710}$, product name, manufactured by Sumitomo Chemical Co., Ltd., and AR2772 and $SEPR_{430}$, product names, manufactured by Shin-Etsu Chemical Co., Ltd. Examples further include fluorine-containing polymer photoresists such as those described in Proc. SPIE, Vol. 3999, 330-334 (2000), Proc. SPIE, Vol. 3999, 357-364 (2000) and Proc. SPIE, Vol. 3999, 365-374 (2000).

Exposure is performed using, for example, i-line radiation, KrF excimer laser beam, ArF excimer laser beam, EUV (extreme ultraviolet ray) or EB (electron beam), through a mask (a reticle) designed to form a predetermined pattern. EUV (extreme ultraviolet ray) is preferably used for the exposure of the resist underlayer film-forming composition of the subject application. An alkaline developer is used for the development, and the conditions are appropriately selected from development temperatures of 5° C. to 50° C. and amounts of development time of 10 seconds to 300 seconds. Examples of the alkaline developers include aqueous solutions of an alkali such as an inorganic alkali including sodium hydroxide, potassium hydroxide, sodium carbonate, sodium silicate, sodium metasilicate and aqueous ammonia; a primary amine including ethylamine and n-propylamine; a secondary amine including diethylamine and di-n-butylamine; a tertiary amine including triethylamine and methyldiethylamine; an alcoholamine including dimethylethanolamine and triethanolamine; a quaternary ammonium salt including tetramethylammonium hydroxide, tetraethylammonium hydroxide and choline; and a cyclic amine including pyrrole and piperidine. An alcohol such as isopropyl alcohol and a surfactant such as nonionic surfactants may be added in an appropriate amount to the aqueous alkali solution mentioned above. Of the developers mentioned above, a quaternary ammonium salt is preferable, and tetramethylammonium hydroxide and choline are more preferable. Additional components such as surfactant may be added to the developer. An organic solvent such as butyl acetate may be used in place of the alkali developer to develop the portions of photoresist that remain low in alkali dissolution rate. A substrate having a pattern of the resist may be produced through the steps described above.

Next, the resist underlayer film is dry-etched using the formed resist pattern as a mask. When the inorganic film described hereinabove is present on the surface of the semiconductor substrate that is used, the etching process exposes the surface of the inorganic film. When there is no inorganic film on the surface of the semiconductor substrate that is used, the etching process exposes the surface of the semiconductor substrate. The substrate is then processed by a method known per se (such as a dry etching step). A semiconductor device may be thus manufactured.

EXAMPLES

The contents of the present invention will be described in detail by presenting Examples below. However, it should not be construed that the scope of the present invention is limited to such Examples.

The weight average molecular weight of polymers described in Synthesis Examples 1 to 8 and Comparative Synthesis Examples 1 and 2 in the present specification is the results measured by gel permeation chromatography (hereinafter, abbreviated as GPC). The measurement was performed using a GPC device manufactured by TOSOH CORPORATION under the following measurement conditions.

GPC columns: Shodex KF803L, Shodex KF802 and Shodex KF801 [registered trademarks] (SHOWA DENKO K.K.)

Column temperature: 40° C.

Solvent: Tetrahydrofuran (THF)

Flow rate: 1.0 ml/min

Standard samples: Polystyrenes (manufactured by TOSOH CORPORATION)

⟨Synthesis Example 1⟩

Polymer 1 was produced as follows. 7.88 g of N,N-diglycidyl-5,5-dimethylhydantoin (manufactured by SHIKOKU CHEMICALS CORPORATION), 5.03 g of monoallylisocyanuric acid (manufactured by SHIKOKU CHEMICALS CORPORATION), 1.45 g of 5-norbornene-2-carboxylic acid (manufactured by Tokyo Chemical Industry Co., Ltd.) and 0.65 g of ethyltriphenylphosphonium bromide (manufactured by Tokyo Chemical Industry Co., Ltd.) were added to 66.60 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 3,000 and a dispersity of 2.8. The structures present in polymer 1 are shown in the following formulas.

[Chem. 13]

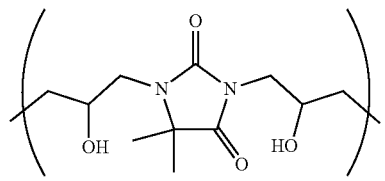
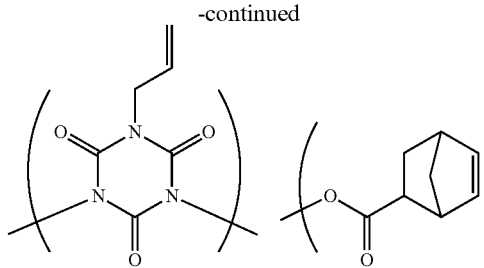

⟨Synthesis Example 2⟩

Polymer 2 was produced as follows. 7.88 g of N,N-diglycidyl-5,5-dimethylhydantoin (manufactured by SHIKOKU CHEMICALS CORPORATION), 5.07 g of monoallylisocyanuric acid (manufactured by SHIKOKU CHEMICALS CORPORATION), 1.34 g of 3-cyclohexene-1-carboxylic acid (manufactured by Tokyo Chemical Industry Co., Ltd.) and 0.66 g of ethyltriphenylphosphonium bromide (manufactured by Tokyo Chemical Industry Co., Ltd.) were added to 66.60 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 2,500 and a dispersity of 2.2. The structures present in polymer 2 are shown in the following formulas.

[Chem. 14]

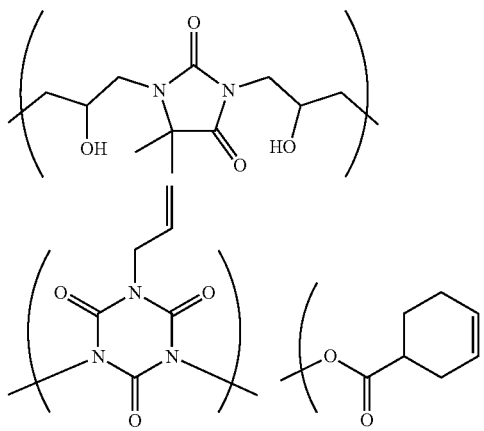

⟨Synthesis Example 3⟩

Polymer 3 was produced as follows. 7.95 g of N,N-diglycidyl-5,5-dimethylhydantoin (manufactured by SHIKOKU CHEMICALS CORPORATION), 5.07 g of monoallylisocyanuric acid (manufactured by SHIKOKU CHEMICALS CORPORATION), 1.74 g of 5-norbornene-2,3-dicarboxylic acid anhydride (manufactured by Tokyo Chemical Industry Co., Ltd.) and 0.66 g of ethyltriphenylphosphonium bromide (manufactured by Tokyo Chemical Industry Co., Ltd.) were added to 66.60 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 2,500 and a dispersity of 2.2. The structures present in polymer 3 are shown in the following formulas.

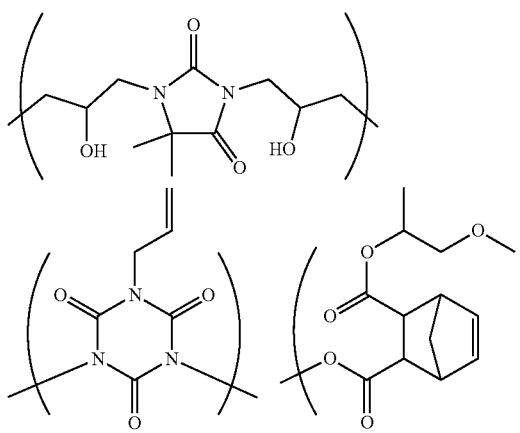

⟨Synthesis Example 4⟩

Polymer 4 was produced as follows. 7.88 g of N,N-diglycidyl-5,5-dimethylhydantoin (manufactured by SHIKOKU CHEMICALS CORPORATION), 5.07 g of monoallylisocyanuric acid (manufactured by SHIKOKU CHEMICALS CORPORATION), 1.73 g of cyclohexane-1-carboxylic acid (manufactured by Tokyo Chemical Industry Co., Ltd.) and 0.63 g of ethyltriphenylphosphonium bromide (manufactured by Tokyo Chemical Industry Co., Ltd.) were added to 66.60 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 2,500 and a dispersity of 2.2. The structures present in polymer 4 are shown in the following formulas.

[Chem. 16]

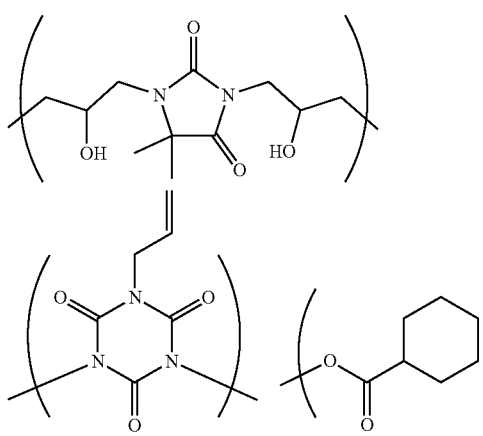

⟨Synthesis Example 5⟩

Polymer 5 was produced as follows. 7.73 g of N,N-diglycidyl-5,5-dimethylhydantoin (manufactured by SHIKOKU CHEMICALS CORPORATION), 4.94 g of monoallylisocyanuric acid (manufactured by SHIKOKU CHEMICALS CORPORATION), 1.71 g of 7-oxabicyclo[2.2.1]hepta-5-ene-2,3-dicarboxylic acid anhydride (manufactured by Tokyo Chemical Industry Co., Ltd.) and 0.64 g of ethyltriphenylphosphonium bromide (manufactured by Tokyo Chemical Industry Co., Ltd.) were added to 66.60 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 2,500 and a dispersity of 2.0. The structures present in polymer 5 are shown in the following formulas.

[Chem. 17]

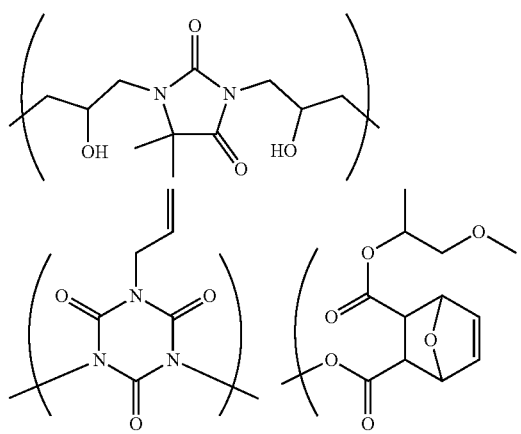

⟨Synthesis Example 6⟩

Polymer 6 was produced as follows. 7.20 g of N,N-diglycidyl-5,5-dimethylhydantoin (manufactured by SHIKOKU CHEMICALS CORPORATION), 4.95 g of 5-hydroxyisophthalic acid (manufactured by Tokyo Chemical Industry Co., Ltd.), 1.33 g of 5-norbornene-2-carboxylic acid (manufactured by Tokyo Chemical Industry Co., Ltd.) and 0.54 g of ethyltriphenylphosphonium bromide (manufactured by Tokyo Chemical Industry Co., Ltd.) were added to 39.19 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 2,500 and a dispersity of 2.2. The structures present in polymer 6 are shown in the following formulas.

[Chem. 18]

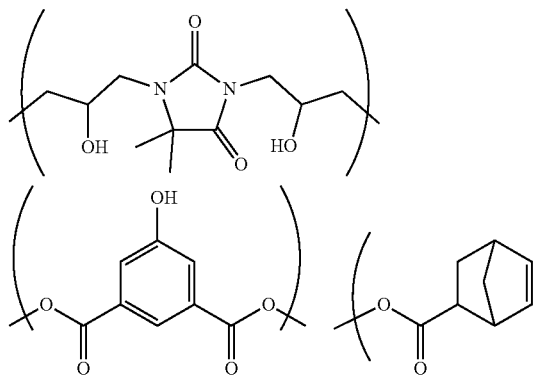

⟨Synthesis Example 7⟩

Polymer 7 was produced as follows. 25.00 g of monoal-lyldiglycidylisocyanuric acid (manufactured by SHIKOKU CHEMICALS CORPORATION), 14.72 g of diethylbarbituric acid (manufactured by Tokyo Chemical Industry Co., Ltd.), 2.91 g of 5-norbornene-2,3-dicarboxylic acid anhydride (manufactured by Tokyo Chemical Industry Co., Ltd.) and 1.64 g of ethyltriphenylphosphonium bromide (manufactured by Tokyo Chemical Industry Co., Ltd.) were added to 89.73 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 3,000 and a dispersity of 2.3. The structures present in polymer 7 are shown in the following formulas.

[Chem. 19]

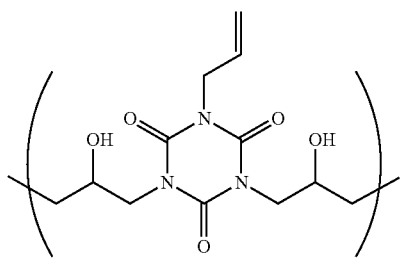

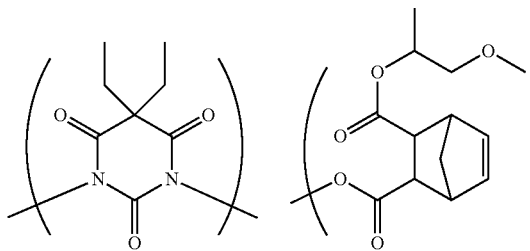

⟨Synthesis Example ⟩

Polymer 8 was produced as follows. 25.00 g of monoal-lyldiglycidylisocyanuric acid (manufactured by SHIKOKU CHEMICALS CORPORATION), 15.86 g of dithiodipropanoic acid (manufactured by Tokyo Chemical Industry Co., Ltd.), 4.80 g of adamantanecarboxylic acid (manufactured by Tokyo Chemical Industry Co., Ltd.) and 1.13 g of tetrabutylphosphonium bromide (manufactured by Tokyo Chemical Industry Co., Ltd.) were added to 57.12 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 5,000 and a dispersity of 2.3. The structures present in polymer 8 are shown in the following formulas.

[Chem. 20]

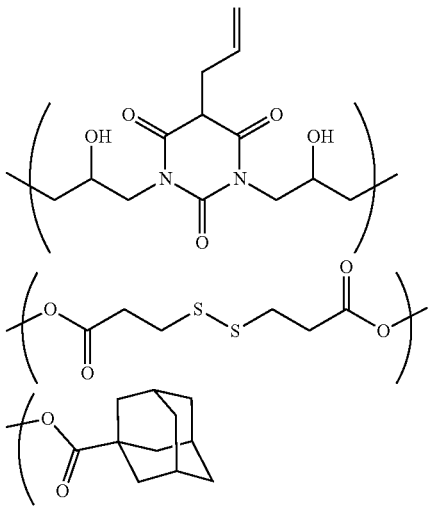

⟨Synthesis Example 9⟩

Polymer 9 was produced as follows. 25.00 g of monoal-lyldiglycidylisocyanuric acid (manufactured by SHIKOKU CHEMICALS CORPORATION), 15.86 g of dithiodipropanoic acid (manufactured by Tokyo Chemical Industry Co., Ltd.), 3.68 g of 5-norbornene-2-carboxylic acid (manufactured by Tokyo Chemical Industry Co., Ltd.) and 1.13 g of tetrabutylphosphonium bromide (manufactured by Tokyo Chemical Industry Co., Ltd.) were added to 57.12 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 5,000 and a dispersity of 2.5. The structures present in polymer 9 are shown in the following formulas.

[Chem. 21]

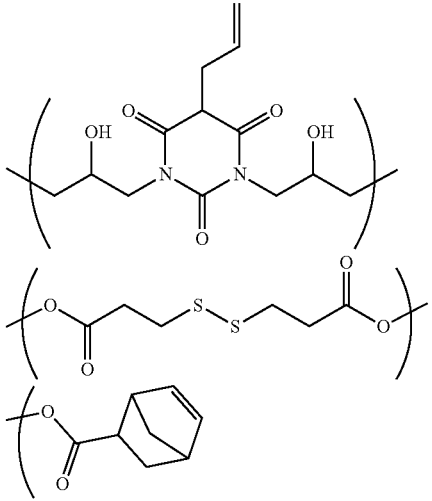

⟨Comparative Synthesis Example 1⟩

Polymer 10 was produced as follows. 21.90 g of mono-allyldiglycidylisocyanuric acid (manufactured by SHIKOKU CHEMICALS CORPORATION), 12.17 g of diethylbarbituric acid (manufactured by Tokyo Chemical Industry Co., Ltd.), 4.67 g of lauric acid (manufactured by Tokyo Chemical Industry Co., Ltd.) and 0.56 g of ethyltriphenylphosphonium bromide (manufactured by Tokyo Chemical Industry Co., Ltd.) were added to 89.73 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 3,000 and a dispersity of 2.2. The structures present in polymer 10 are shown in the following formulas.

[Chem. 22]

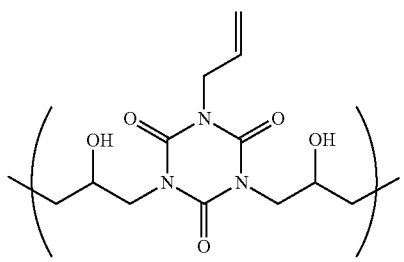

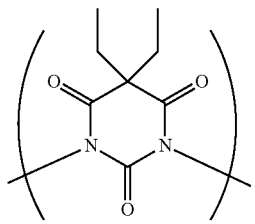

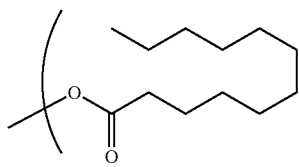

⟨Comparative Synthesis Example 2⟩

Polymer 11 was produced as follows. 25.00 g of monoallyldiglycidylisocyanuric acid (manufactured by SHIKOKU CHEMICALS CORPORATION), 15.86 g of dithiodipropanoic acid (manufactured by Tokyo Chemical Industry Co., Ltd.) and 1.13 g of tetrabutylphosphonium bromide (manufactured by Tokyo Chemical Industry Co., Ltd.) were added to 57.12 g of propylene glycol monomethyl ether to form a solution. After the reaction vessel was purged with nitrogen, the reaction was carried out at 110° C. for 24 hours to form a polymer solution. GPC analysis showed that the obtained polymer had a weight average molecular weight in terms of the standard polystyrene of 5,000 and a dispersity of 4.3. The structures present in polymer 11 are shown in the following formulas.

[Chem. 23]

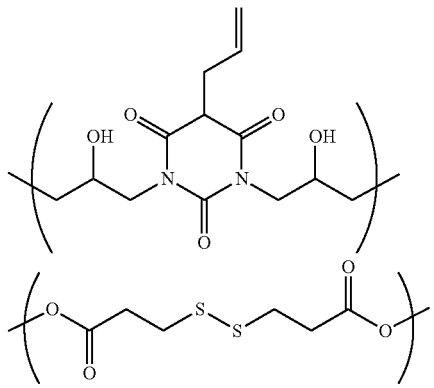

(Preparation of Resist Underlayer Film)

Example 1

Each of the polymers of Synthesis Examples 1 to 9 and Comparative Synthesis Examples 1 and 2, a crosslinking agent, a curing catalyst and a solvent were mixed together in a ratio indicated in Table 1, and the resultant mixture was filtered through a 0.1 µm fluororesin filter to form a solution of the resist underlayer film-forming composition.

In Table 1, PL-LI is the abbreviation for tetramethoxymethylglycoluril (manufactured by Nippon Cytec Industries), PyPTS for pyridinium-p-toluenesulfonic acid, PyPSA for pyridinium-p-hydroxybenzenesulfonic acid, PGMEA for propylene glycol monomethyl ether acetate, and PGME for propylene glycol monomethyl ether. The amounts are shown by parts by mass.

TABLE 1

| | Polymer | Crosslinking agent | Curing catalyst | Solvent | |
|---|---|---|---|---|---|
| Example 1 (Parts by mass) | Synthesis Example 1 0.15 | PL-LI 0.04 | PyPTS 0.01 | PGMEA 90 | PGME 10 |
| Example 2 (Parts by mass) | Synthesis Example 0.15 | PL-LI 0.04 | PyPSA 0.01 | PGMEA 90 | PGME 10 |
| Example 3 (Parts by mass) | Synthesis Example 2 0.15 | PL-LI 0.04 | PyPSA 0.01 | PGMEA 90 | PGME 10 |
| Example 4 (Parts by mass) | Synthesis Example 3 0.15 | PL-LI 0.04 | PyPSA 0.01 | PGMEA 90 | PGME 10 |
| Example 5 (Parts by mass) | Synthesis Example 4 0.15 | PL-LI 0.04 | PyPSA 0.01 | PGMEA 90 | PGME 10 |
| Example 6 (Parts by mass) | Synthesis Example 5 0.15 | PL-LI 0.04 | PyPSA 0.01 | PGMEA 90 | PGME 10 |
| Example 7 (Parts by mass) | Synthesis Example 6 0.15 | PL-LI 0.04 | PyPSA 0.01 | PGMEA 90 | PGME 10 |
| Example 8 (Parts by mass) | Synthesis Example 7 0.15 | PL-LI 0.04 | PyPSA 0.01 | PGMEA 90 | PGME 10 |
| Example 9 (Parts by mass) | Synthesis Example 8 0.15 | PL-LI 0.04 | 0 01 | PGMEA 90 | PGME 10 |
| Example 10 (Parts by mass) | Synthesis Example 9 0.15 | PL-LI 0.04 | PyPSA 0.01 | PGMEA 90 | PGME 10 |

TABLE 1-continued

| | Polymer | Crosslinking agent | Curing catalyst | Solvent | |
|---|---|---|---|---|---|
| Example 11 (Parts by mass) | Synthesis Example 1 0.15 | TMOM = BP 0.04 | PyPSA 0.01 | PGMEA 90 | PGME 10 |

TABLE 2

| | Polymer | Crosslinking agent | Curing catalyst | Solvent | |
|---|---|---|---|---|---|
| Comparative Example 1 (Parts by mass) | Comparative Synthesis Example 1 0.15 | PL-LI 0.04 | PyPSA 0.01 | PGMEA 90 | PGME 10 |
| Comparative Example 2 (Parts by mass) | Comparative Synthesis Example 2 0.15 | PL-LI 0.04 | PyPSA 0.01 | PGMEA 70 | PGME 30 |

(Test of Dissolution into Photoresist Solvent)

The resist underlayer film-forming compositions of Examples 1 to 11 and Comparative Examples 1 and 2 were each applied onto a silicon wafer using a spinner. The silicon wafers were baked on a hot plate at 205° C. for 60 seconds to form films having a film thickness of 5 nm. These resist underlayer films were soaked in a solvent used for photoresists, specifically, a 70/30 mixed solution of propylene glycol monomethyl ether/propylene glycol monomethyl ether. They were rated as good when the change in film thickness was not more than 1 Å and as poor when the change in film thickness was not less than 1 Å. The results are shown in Table 3. Only Comparative Example 1 was rated as poor.

(Measurement of Water Contact Angle)

The resist underlayer film-forming compositions of Examples 1 to 11 and Comparative Examples 1 and 2 were each applied onto a silicon wafer using a spinner. The silicon wafers were baked on a hot plate at 205° C. for 60 seconds to form films having a film thickness of 5 nm. These resist underlayer films were analyzed by a sessile drop method using a fully automatic contact angle meter DM-701 (manufactured by Kyowa Interface Science Co., Ltd.) to determine the water contact angle.

TABLE 3

| | Water contact angle | Dissolution test |
|---|---|---|
| Example 1 | 48° | Good |
| Example 2 | 47° | Good |
| Example 3 | 45° | Good |
| Example 4 | 46° | Good |
| Example 5 | 56° | Good |
| Example 6 | 46° | Good |
| Example 7 | 40° | Good |
| Example 8 | 58° | Good |
| Example 9 | 61° | Good |
| Example 10 | 52° | Good |
| Example 11 | 50° | Good |
| Comparative Example 1 | 73° | Poor |
| Comparative Example 2 | 53° | Good |

(Resist Patterning Evaluation)
[Formation of Resist Patterns by KrF Exposure]

DUV-30J (manufactured by Nissan Chemical Corporation) as an antireflection film was applied onto silicon wafers using a spinner. The silicon wafers were baked on a hot plate at 205° C. for 60 seconds to form a film having a film thickness of 18 nm. Each of the resist underlayer film-forming compositions of Examples 1 to 6, Example 8 and Comparative Examples 1 and 2 was applied onto the film on the silicon wafers using a spinner. The silicon wafers were baked on a hot plate at 205° C. for 60 seconds to form a resist underlayer film having a film thickness of 5 nm. Each of the resist underlayer films was spin-coated with SEPR-430 (manufactured by Shin-Etsu Chemical Co., Ltd.) as a KrF excimer laser positive resist solution, and the coating was heated at 100° C. for 60 seconds to form a KrF resist film.

The resist film was exposed under the predetermined conditions using a KrF excimer laser exposure apparatus (NSR S205C manufactured by Nikon Corporation). After the exposure, postexposure baking was performed at 110° C. for 60 seconds. The latent images were developed by 60 seconds of paddling in a 2.38% aqueous tetramethylammonium hydroxide solution (trade name: NMD-3, manufactured by TOKYO OHKA KOGYO CO., LTD.) as a photoresist developer. The photoresist patterns thus obtained were inspected, and those without large pattern separation were evaluated as good.

TABLE 4

| Example 1 | Good (undercut) |
|---|---|
| Example 2 | Good (straight) |
| Example 3 | Good (straight) |
| Example 4 | Good (straight) |
| Example 5 | Good (straight) |
| Example 6 | Good (straight) |
| Example 8 | Good (straight) |
| Comparative Example 2 | Poor (collapsed pattern) |

[EUV Exposure Test]

Silicon wafers were spin-coated with each of the resist underlayer film-forming compositions of Examples 9 and 10 of the present invention and Comparative Example 2. Each of the coatings was heated at 215° C. for 1 minute to form a resist underlayer film (film thickness: 5 nm). Each of the resist underlayer films was spin-coated with an EUV resist solution (a methacrylate resin resist). The coating was heated and exposed using an EUV exposure apparatus (NXE3300 manufactured by ASML) under the conditions where NA=0.33, Dipole. After the exposure, the film was subjected to postexposure baking (PEB, 100° C., 60 seconds), cooled to room temperature on a cooling plate, developed with an alkali, and rinsed. A resist pattern was thus formed on each of the silicon wafers. The resist pattern was evaluated in view of whether or not 16 nm lines and spaces (L/S) had been formed. It was confirmed that a 16 nm L/S pattern had been formed in all of Example 9, Example 10 and Comparative Example 2. Further, an optimum exposure dose (EOP), which is defined as the exposure dose at which 16 nm lines/32 nm pitches (lines and spaces (L/S=1/1) were formed, is shown. Furthermore, the line width roughness (LWR) in these patterns is shown in Table 5. It was found that Example 9 and Example 10 attained an enhancement in LWR as compared with Comparative Example 2.

TABLE 5

| | EOP | LWR |
|---|---|---|
| Example 9 | 49.3 mJ/cm$^2$ | 3.89 nm |
| Example 10 | 49.3 mJ/cm$^2$ | 3.91 nm |
| Comparative Example 2 | 49.3 mJ/cm$^2$ | 4.14 nm |

[EUV Exposure Test]

A silicon wafer was spin-coated with the resist underlayer film-forming composition of Example 1 of the present invention. The coating was heated at 215° C. for 1 minute to form a resist underlayer film (film thickness: 5 nm). The resist underlayer film was further spin-coated with an EUV resist solution (a methacrylate resin resist). The coating was heated at 130° C. for 1 minute to form an EUV resist film. The film was then exposed using an EUV exposure apparatus (NXE3300B manufactured by ASML) under the conditions where NA=0.33, Dipole. After the exposure, the film was subjected to postexposure baking (PEB, 110° C., 1 minute), cooled to room temperature on a cooling plate, developed with an organic solvent developer (butyl acetate) for 60 seconds, and rinsed. A resist pattern was thus formed.

Resist patterns were formed in the similar manner using each of the compositions obtained in Examples 3 and 6 to 8 and Comparative Example 2.

The resist patterns were evaluated by cross-sectional observation of the pattern shape to determine whether 22 nm lines and spaces at 44 nm pitches had been formed.

In the observation of the pattern shape, the pattern shape was evaluated as "good" when the shape was between footing and undercut and there was no marked residue in the spaces, "collapsed" when the shape of the resist pattern was undesirable due to separation or collapse, and "bridged" when upper or lower portions of the resist pattern were in undesired contact with each other. The results are shown in Table 6.

[Table 6]

TABLE 6

|  | Pattern shape |
|---|---|
| Example 3 | Good |
| Example 6 | Good |
| Example 7 | Good |
| Example 8 | Good |
| Comparative Example 2 | Collapsed |

INDUSTRIAL APPLICABILITY

The resist underlayer film-forming composition according to the present invention is a composition for forming a resist underlayer film that allows a desired resist pattern to be formed. The resist underlayer film-forming composition is useful in a method for producing a substrate with a resist pattern, and a method for manufacturing a semiconductor device.

The invention claimed is:

1. A resist underlayer film-forming composition comprising
    an organic solvent and
    a polymer consisting essentially of, in the main chain, at least one of the structural unit represented by formula (3):

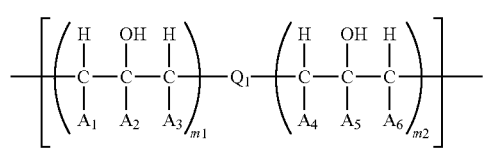

wherein in formula (3), $A_1$, $A_2$, $A_3$, $A_4$, $A_5$ and $A_6$ each independently denote a hydrogen atom, a methyl group or an ethyl group; $Q_1$ denotes a divalent organic group; and $m_1$ and $m_2$ each independently denote 1, and the polymer further having an aliphatic ring at a terminal,
    wherein the aliphatic ring is optionally substituted with a substituent, and
    wherein the aliphatic ring is derived by reacting at least one of the following compounds with a polymer terminal:

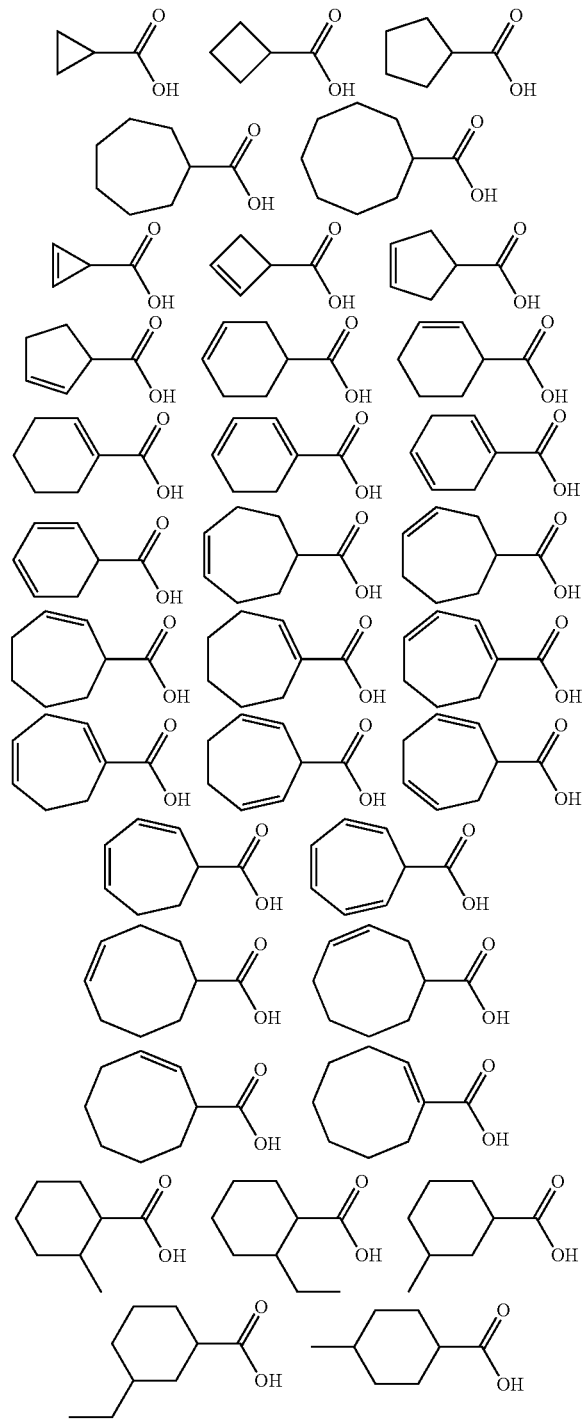

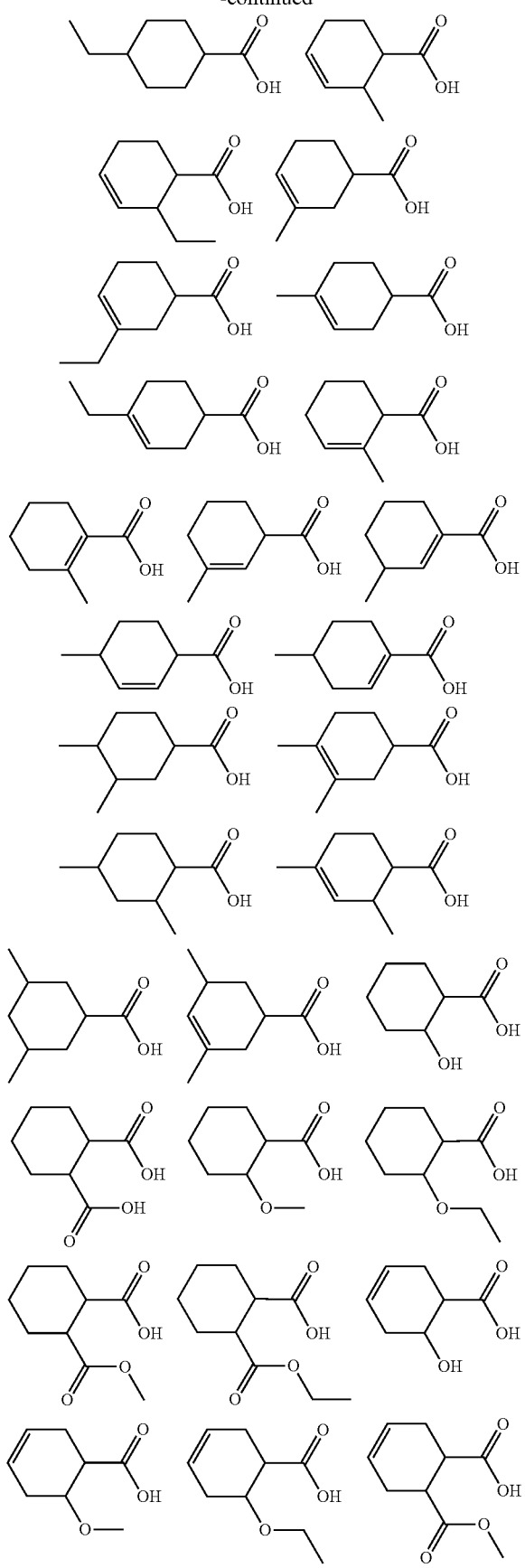
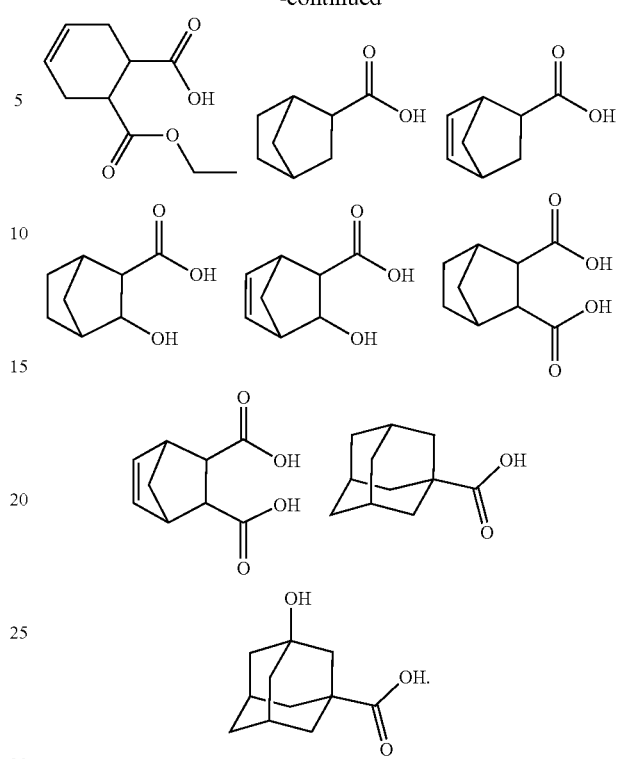
2. A resist underlayer film-forming composition comprising
an organic solvent and
a polymer having an aliphatic ring at a terminal,
wherein the aliphatic ring is optionally substituted with a substituent, and
wherein the aliphatic ring is derived by reacting at least one of the following compounds with a polymer terminal:
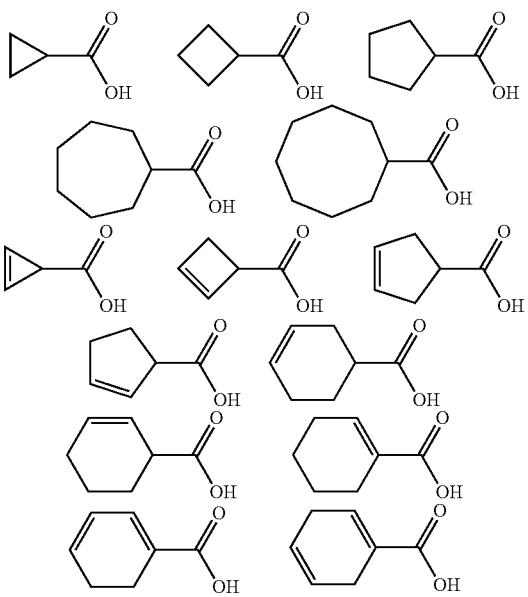

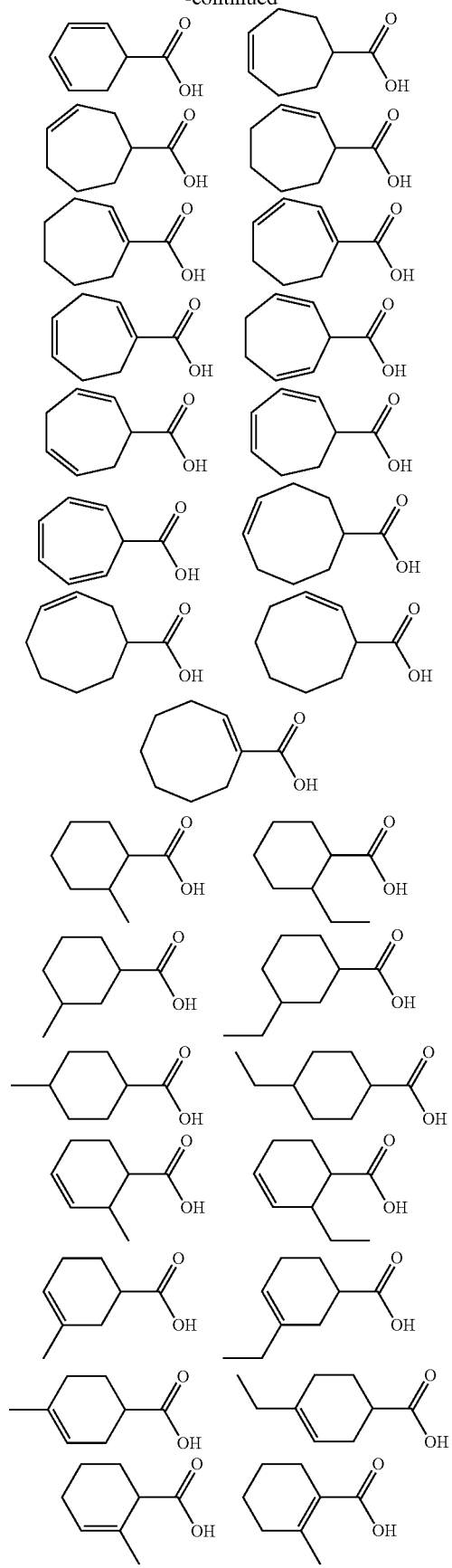
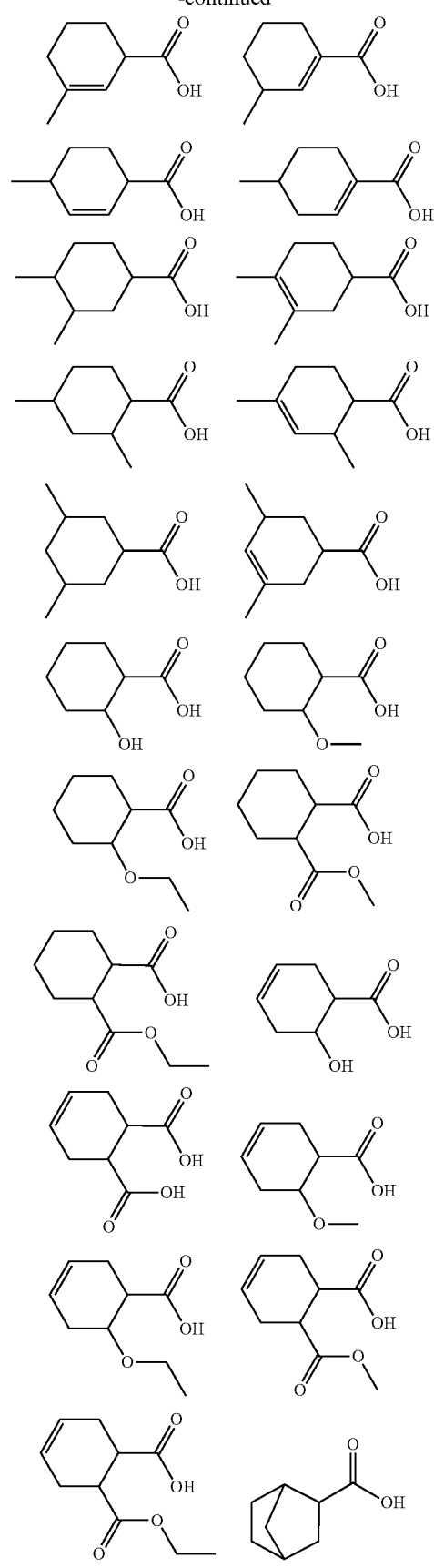

-continued

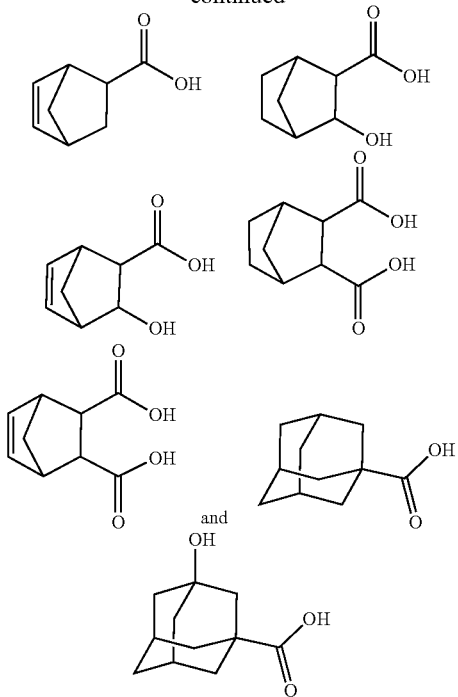

wherein the polymer further includes a disulfide bond in the main chain.

3. The resist underlayer film-forming composition according to claim 2, wherein the aliphatic ring is a C3-C10 monocyclic or polycyclic aliphatic ring.

4. The resist underlayer film-forming composition according to claim 3, wherein the polycyclic aliphatic ring is bicyclic or tricyclic.

5. The resist underlayer film-forming composition according to claim 2, wherein the aliphatic ring has at least one unsaturated bond.

6. The resist underlayer film-forming composition according to claim 2, wherein the substituent is selected from hydroxy group, a linear or branched C1-C10 alkyl group, C1-C20 alkoxy group, C1-C10 acyloxy group and carboxy group.

7. The resist underlayer film-forming composition according to claim 1, wherein $Q_1$ in formula (3) denotes a divalent organic group represented by formula (5) below:

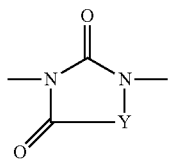

wherein Y denotes a divalent group represented by formula (6) or formula (7) below:

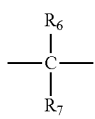

-continued $$\begin{array}{c} R_6 \\ | \\ -C-C- \\ | \quad \| \\ R_7 \quad O \end{array} \quad (7)$$

wherein $R_6$ and $R_7$ each independently denote a hydrogen atom, a C1-C6 alkyl group, a C3-C6 alkenyl group, a benzyl group or a phenyl group, the phenyl group being optionally substituted with at least one member selected from the group consisting of a C1-C6 alkyl group, halogen atom, a C1-C6 alkoxy group, nitro group, cyano group and a C1-C6 alkylthio group, or $R_6$ and $R_7$ may be bonded to each other to form a C3-C6 ring together with the carbon atom to which $R_6$ and $R_7$ are bonded.

8. The resist underlayer film-forming composition according to claim 1, wherein the polymer further includes a disulfide bond in the main chain.

9. The resist underlayer film-forming composition according to claim 1, further comprising a curing catalyst.

10. The resist underlayer film-forming composition according to claim 1, further comprising a crosslinking agent.

11. A resist underlayer film, which is a calcined product of a coating film comprising the resist underlayer film-forming composition according to claim 1.

12. A method for producing a patterned substrate, comprising the steps of:
applying the resist underlayer film-forming composition according to claim 1 onto a semiconductor substrate and baking the resist underlayer film-forming composition to form a resist underlayer film;
applying a resist onto the resist underlayer film and baking the resist to form a resist film;
exposing the semiconductor substrate coated with the resist underlayer film and the resist; and
developing the exposed resist film to perform patterning.

13. A method for manufacturing a semiconductor device, comprising the steps of:
forming on a semiconductor substrate a resist underlayer film using the resist underlayer film-forming composition according to claim 1;
forming a resist film on the resist underlayer film;
forming a resist pattern by irradiating the resist film with light or electron beam followed by development;
forming a patterned resist underlayer film by etching the resist underlayer film through the formed resist pattern; and
processing the semiconductor substrate through the patterned resist underlayer film.

14. The resist underlayer film-forming composition according to claim 2, wherein the polymer has, in the main chain, at least one of the structural unit represented by formula (3) below:

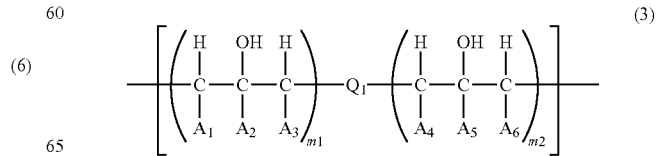

wherein in formula (3), $A_1$, $A_2$, $A_3$, $A_4$, $A_5$ and $A_6$ each independently denote a hydrogen atom, a methyl group or an ethyl group; $Q_1$ denotes a divalent organic group; and $m_1$ and $m_2$ each independently denote 0 or 1.

15. The resist underlayer film-forming composition according to claim 14, wherein $Q_1$ in formula (3) denotes a divalent organic group represented by formula (5) below:

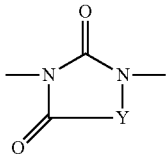

(5)

wherein Y denotes a divalent group represented by formula (6) or formula (7) below:

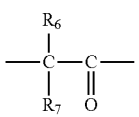

(6)

(7)

wherein $R_6$ and $R_7$ each independently denote a hydrogen atom, a C1-C6 alkyl group, a C3-C6 alkenyl group, a benzyl group or a phenyl group, the phenyl group being optionally substituted with at least one member selected from the group consisting of a C1-C6 alkyl group, halogen atom, a C1-C6 alkoxy group, nitro group, cyano group and a C1-C6 alkylthio group, or $R_6$ and $R_7$ may be bonded to each other to form a C3-C6 ring together with the carbon atom to which $R_6$ and $R_7$ are bonded.

16. The resist underlayer film-forming composition according to claim 2, further comprising a curing catalyst.

17. The resist underlayer film-forming composition according to claim 2, further comprising a crosslinking agent.

18. A resist underlayer film, which is a calcined product of a coating film comprising the resist underlayer film-forming composition according to claim 2.

19. A method for manufacturing a semiconductor device, comprising the steps of:
   forming on a semiconductor substrate a resist underlayer film using the resist underlayer film-forming composition according to claim 2;
   forming a resist film on the resist underlayer film;
   forming a resist pattern by irradiating the resist film with light or electron beam followed by development;
   forming a patterned resist underlayer film by etching the resist underlayer film through the formed resist pattern; and
   processing the semiconductor substrate through the patterned resist underlayer film.

* * * * *